(12) United States Patent
Starr et al.

(10) Patent No.: US 7,242,229 B1
(45) Date of Patent: Jul. 10, 2007

(54) PHASE LOCKED LOOP (PLL) AND DELAY LOCKED LOOP (DLL) COUNTER AND DELAY ELEMENT PROGRAMMING IN USER MODE

(75) Inventors: Gregory W. Starr, San Jose, CA (US); Richard Yen-Hsiang Chang, San Jose, CA (US); Edward P. Aung, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/138,600

(22) Filed: May 3, 2002

Related U.S. Application Data (60) Provisional application No. 60/289,268, filed on May 6, 2001, provisional application No. 60/289,245, filed on May 6, 2001.

(51) Int. Cl.
*H03L 7/00* (2006.01)

(52) U.S. Cl. .................. 327/156; 327/160; 327/115; 331/1 A (58) Field of Classification Search ............. 327/156, 327/159, 160, 115, 116, 117, 118; 331/1 A, 331/40, 16
See application file for complete search history.

(56) References Cited

U.S. PATENT DOCUMENTS

| | | | |
|---|---|---|---|
| 2,888,557 A | 5/1959 | Schneider | |
| 4,079,371 A | 3/1978 | Shimamura | |
| 4,225,830 A | 9/1980 | Remy | |
| 4,246,547 A | 1/1981 | Gerard et al. | |
| 4,254,504 A | 3/1981 | Lewis et al. | |
| 4,365,349 A | 12/1982 | Ogita et al. | |
| 4,475,208 A | 10/1984 | Ricketts | ......................... 375/1 |
| 4,521,744 A * | 6/1985 | Yamada et al. | ............. 331/1 A |
| 4,629,999 A | 12/1986 | Hatch et al. | |
| 4,795,985 A | 1/1989 | Gailbreath, Jr. | |
| 4,864,253 A | 9/1989 | Zwack | |

(Continued)

FOREIGN PATENT DOCUMENTS

EP 0096106 A1 12/1983

(Continued)

OTHER PUBLICATIONS

U.S. Appl. No. 10/137,802, filed May 1, 2002 by Greg Starr. PLL/DLL Circuitry Programmable for That Low Bandwidth Applications.

(Continued)

*Primary Examiner*—Timothy P. Callahan
*Assistant Examiner*—An T. Luu
(74) *Attorney, Agent, or Firm*—Ropes & Gray LLP; Jeffrey H. Ingerman; Chia-Hao La (57) ABSTRACT

A PLL circuit is described. The PLL circuit includes: a signal generator and at least one divider coupled to the signal generator, where the at least one divider is programmable in user mode. In one embodiment, the PLL circuit includes a memory device associated with the at least one divider, where the memory device receives settings data and provides settings data to the at least one divider in user mode.

104 Claims, 2 Drawing Sheets

U.S. PATENT DOCUMENTS

| | | | |
|---|---|---|---|
| 5,058,204 A | 10/1991 | Tahernia et al. | 455/183 |
| 5,109,394 A | 4/1992 | Hjerpe et al. | |
| 5,144,173 A | 9/1992 | Hui | 327/277 |
| 5,256,980 A * | 10/1993 | Itri | 328/104 |
| 5,256,994 A | 10/1993 | Langendorf | |
| 5,319,735 A | 6/1994 | Preuss et al. | 395/2.14 |
| 5,334,952 A | 8/1994 | Maddy et al. | |
| 5,347,232 A | 9/1994 | Nishimichi | |
| 5,371,772 A | 12/1994 | Al-Khairi | |
| 5,444,420 A | 8/1995 | Wernlund | |
| 5,453,706 A | 9/1995 | Yee | 326/93 |
| 5,517,155 A | 5/1996 | Yamauchi et al. | |
| 5,578,968 A | 11/1996 | Mori et al. | |
| 5,629,962 A | 5/1997 | Okumura et al. | |
| 5,631,920 A | 5/1997 | Hardin | 375/200 |
| 5,646,564 A | 7/1997 | Erickson et al. | |
| RE35,650 E | 11/1997 | Partyka et al. | 375/206 |
| 5,684,434 A | 11/1997 | Mann et al. | |
| 5,691,660 A | 11/1997 | Busch et al. | |
| 5,712,595 A * | 1/1998 | Yokoyama | 331/2 |
| 5,737,329 A | 4/1998 | Horiguchi | 370/342 |
| 5,754,598 A | 5/1998 | Barrett, Jr. et al. | |
| 5,771,264 A | 6/1998 | Lane | |
| 5,787,135 A | 7/1998 | Clark | |
| 5,818,302 A | 10/1998 | Otsuka et al. | |
| 5,838,204 A | 11/1998 | Yao | |
| 5,872,807 A | 2/1999 | Booth et al. | 375/200 |
| 5,877,657 A | 3/1999 | Yoshinaka | |
| 5,892,407 A | 4/1999 | Ishii | |
| 5,898,617 A | 4/1999 | Bushey et al. | 365/185.2 |
| 5,903,197 A | 5/1999 | Kikugawa | |
| 5,910,740 A | 6/1999 | Underwood | |
| 5,914,980 A | 6/1999 | Yokota et al. | 375/200 |
| 5,930,231 A | 7/1999 | Miller et al. | |
| 5,964,880 A | 10/1999 | Liu et al. | |
| 5,977,836 A | 11/1999 | Swan et al. | |
| 5,982,210 A | 11/1999 | Rogers | |
| 5,990,714 A | 11/1999 | Takahashi | |
| 5,994,934 A | 11/1999 | Yoshimura et al. | |
| 6,011,732 A | 1/2000 | Harrison et al. | |
| 6,028,463 A | 2/2000 | Albu et al. | |
| 6,043,677 A | 3/2000 | Albu et al. | |
| 6,046,603 A | 4/2000 | New | 326/38 |
| 6,046,646 A | 4/2000 | Lo et al. | 331/110 |
| 6,057,704 A | 5/2000 | New et al. | 326/38 |
| 6,057,739 A | 5/2000 | Crowley et al. | 331/14 |
| 6,060,902 A | 5/2000 | Albu et al. | |
| 6,081,164 A * | 6/2000 | Shigemori et al. | 331/16 |
| 6,084,448 A | 7/2000 | Koszarsky | |
| 6,087,868 A | 7/2000 | Millar | |
| 6,091,263 A | 7/2000 | New et al. | 326/40 |
| 6,114,915 A | 9/2000 | Huang et al. | |
| 6,127,865 A | 10/2000 | Jefferson | |
| 6,137,327 A | 10/2000 | Schnell | |
| 6,147,525 A | 11/2000 | Mitani et al. | |
| 6,150,859 A | 11/2000 | Park | |
| 6,163,184 A | 12/2000 | Larsson | |
| 6,163,186 A | 12/2000 | Kurita | |
| 6,173,025 B1 | 1/2001 | Jokura | |
| 6,181,158 B1 | 1/2001 | Cheung et al. | 326/38 |
| 6,184,713 B1 | 2/2001 | Agrawal et al. | |
| 6,188,255 B1 | 2/2001 | Mann | |
| 6,191,613 B1 | 2/2001 | Schultz et al. | |
| 6,201,448 B1 | 3/2001 | Tam et al. | |
| 6,218,876 B1 | 4/2001 | Sung et al. | |
| 6,263,011 B1 | 7/2001 | Paik et al. | 375/149 |
| 6,275,077 B1 | 8/2001 | Tobin et al. | 327/108 |
| 6,281,721 B1 | 8/2001 | Kinget et al. | |
| 6,282,249 B1 | 8/2001 | Tomesen et al. | 375/327 |
| 6,289,068 B1 | 9/2001 | Hassoun et al. | |
| 6,337,589 B1 | 1/2002 | Ooishi | |
| 6,356,122 B2 | 3/2002 | Sevalia et al. | |
| 6,366,174 B1 | 4/2002 | Berry et al. | 331/78 |
| 6,369,624 B1 | 4/2002 | Wang et al. | |
| 6,389,092 B1 | 5/2002 | Momtaz | 375/376 |
| 6,417,739 B1 | 7/2002 | Chacko | 331/17 |
| 6,441,660 B1 | 8/2002 | Ingino, Jr. | 327/156 |
| 6,462,579 B1 | 10/2002 | Camilleri et al. | |
| 6,462,594 B1 | 10/2002 | Robinson et al. | 327/159 |
| 6,483,886 B1 | 11/2002 | Sung et al. | |
| 6,507,211 B1 | 1/2003 | Schultz et al. | |
| 6,512,801 B1 | 1/2003 | Ninomiya | |
| 6,525,562 B1 | 2/2003 | Schultz et al. | |
| 6,526,557 B1 | 2/2003 | Young et al. | |
| 6,539,072 B1 | 3/2003 | Donnelly et al. | |
| 6,542,040 B1 | 4/2003 | Lesea | |
| 6,587,005 B2 | 7/2003 | Ichihara | |
| 6,618,462 B1 | 9/2003 | Ross et al. | |
| 6,636,727 B2 | 10/2003 | Muschallik et al. | |
| 6,642,758 B1 | 11/2003 | Wang et al. | |
| 6,651,181 B1 | 11/2003 | Lacey | |
| 6,661,293 B2 | 12/2003 | Paananen | |
| 6,680,874 B1 | 1/2004 | Harrison | |
| 6,690,224 B1 | 2/2004 | Moore | |
| 6,731,147 B2 | 5/2004 | Fiscus | |
| 6,731,148 B2 | 5/2004 | Lau et al. | |
| 6,744,285 B2 | 6/2004 | Mangum et al. | |
| 6,768,358 B2 | 7/2004 | Birk et al. | |
| 6,774,690 B2 | 8/2004 | Baker et al. | |
| 6,795,043 B2 | 9/2004 | Shibata | |
| 6,810,514 B1 | 10/2004 | Alfke et al. | |
| 6,836,842 B1 | 12/2004 | Guccione et al. | |
| 6,853,252 B2 | 2/2005 | Dickman | |
| 6,856,180 B1 | 2/2005 | Starr et al. | |
| 6,870,411 B2 | 3/2005 | Shibahara et al. | |
| 6,914,464 B2 | 7/2005 | Maeda | |
| 6,920,622 B1 | 7/2005 | Garlepp et al. | |
| 6,920,627 B2 | 7/2005 | Blodget et al. | |
| 6,924,678 B2 | 8/2005 | Starr | |
| 6,947,514 B1 | 9/2005 | Kato et al. | |
| 2001/0027092 A1 | 10/2001 | Muschallik et al. | |
| 2002/0008588 A1 | 1/2002 | Khan | |
| 2002/0021153 A1 | 2/2002 | Saeki | |
| 2002/0027459 A1 | 3/2002 | Fallahi et al. | |
| 2002/0036525 A1 | 3/2002 | Hwang | |
| 2002/0159303 A1 | 10/2002 | Ware et al. | |
| 2003/0071665 A1 | 4/2003 | Oyama | |
| 2004/0189359 A1 | 9/2004 | Shah et al. | |
| 2004/0189405 A1 | 9/2004 | Shah et al. | |
| 2004/0189406 A1 | 9/2004 | Shah et al. | |
| 2004/0217787 A1 | 11/2004 | Wong et al. | |
| 2004/0217788 A1 | 11/2004 | Kim | |
| 2004/0232995 A1 | 11/2004 | Thomsen et al. | |
| 2004/0239387 A1 | 12/2004 | Zhang et al. | |
| 2005/0024107 A1 | 2/2005 | Takai et al. | |
| 2005/0024118 A1 | 2/2005 | Agrawal et al. | |
| 2005/0028019 A1 | 2/2005 | Kim | |
| 2005/0052208 A1 | 3/2005 | Starr | |
| 2005/0110542 A1 | 5/2005 | Byun | |
| 2005/0127961 A1 | 6/2005 | Ngo | |
| 2005/0140416 A1 | 6/2005 | Rashid | |
| 2005/0168260 A1 | 8/2005 | Tomerlin et al. | |
| 2005/0189974 A1 | 9/2005 | Chao | |
| 2005/0200390 A1 | 9/2005 | Starr et al. | |
| 2005/0206419 A1 | 9/2005 | Kizer et al. | |
| 2005/0218937 A1 | 10/2005 | Johnson et al. | |
| 2005/0219000 A1 | 10/2005 | Wu | |
| 2005/0231247 A1 | 10/2005 | Cho | |
| 2005/0240791 A1 | 10/2005 | Lin | |
| 2005/0242854 A1 | 11/2005 | Kang et al. | |

| | | | |
|---|---|---|---|
| 2005/0242855 | A1 | 11/2005 | Lee |

FOREIGN PATENT DOCUMENTS

| | | | |
|---|---|---|---|
| EP | 0519489 | A1 | 12/1992 |
| EP | 0 655 829 | A1 | 5/1995 |
| EP | 0670635 | A2 | 9/1995 |
| EP | 0310088 | B1 | 6/1996 |
| EP | 0682413 | B1 | 3/1998 |
| EP | 0828204 | A1 | 3/1998 |
| EP | 0913947 | A2 | 5/1999 |
| EP | 1 020 995 | A1 | 7/2000 |
| GB | 0785568 | A | 10/1957 |
| GB | 2083307 | A | 3/1982 |
| GB | 2253750 | A | 9/1992 |
| GB | 2298726 | A | 9/1996 |
| GB | 2337881 | A | 12/1999 |
| GB | 2346275 | A | 8/2000 |
| JP | 2004/120433 | A | 4/2004 |
| WO | WO 97/36370 | A1 | 10/1997 |
| WO | WO 02/058243 | A1 | 7/2002 |
| WO | WO 04/079913 | A1 | 9/2004 |

OTHER PUBLICATIONS

Chen, O.T.-C. et al., "A power-efficient wide-range phase-locked loop," IEEE Journal of Solid-State Circuits, vol. 37, No. 1, Jan. 2002, pp. 51-62.

Sumi, Yasuaki et al., "New PLL frequency synthesizer using multi-programmer divider," *1998 Digest of Technical Papers: IEEE International Conference on Consumer Electronics*, WPM 17.7, pp. 300-301, Jun. 2-4, 1998.

Song, J.-S. et al., "A new phase-locked loop used in a frequency synthesizer," IEEE Transactions on Instrumentation and Measurement, vol. 41, No. 3, pp. 432-437, Jun. 1992.

Wulich, D. et al., "Fast frequency synthesizer based on PLL and a continuous phase divider," International Journal of Electronics, vol. 70, No. 5, pp. 891-899, May 1991.

Dave Burskey, "Programmable Clock Generator Solves System-Timing Woes," http://www.elecdesign.com/Articles/Index.cfm?AD=1&ArticleID=1720, Dec. 23, 2002.

W1zzard, "What is a PLL?," http://www.techpowerup.com/articles/overclocking/28, May 24, 2004.

\* cited by examiner

PHASE LOCKED LOOP (PLL) AND DELAY LOCKED LOOP (DLL) COUNTER AND DELAY ELEMENT PROGRAMMING IN USER MODE

CROSS-REFERENCE TO RELATED APPLICATIONS

This application claims the benefits of U.S. Provisional Application Ser. Nos. 60/289,245 and 60/289,268, filed May 6, 2001, and entitled "Phase Lock Loop (PLL) And Delay Lock Loop (DLL) Counter And Delay Element Programming In User Mode" and "Programmable Loop Bandwidth In Phase Locked Loop (PLL) Circuit", respectively.

This application is being filed concurrently with (1) the U.S. Patent Application of Gregory W. Starr and Wanli Chang for "Programmable Loop Bandwidth In Phase Locked Loop (PLL) Circuit", (2) the U.S. Patent Application of Wanli Chang and Gregory W. Starr for "Programmable Current Reference Circuit", and (3) the U.S. Patent Application of Gregory W. Starr and Wanli Chang for "Analog Implementation of Spread Spectrum Frequency Modulation In A Programmable Phase Locked Loop (PLL) System", and incorporates the material therein by reference.

BACKGROUND OF THE INVENTION

1. Field of the Invention

This invention relates generally to electronic circuits and, in particular, to phase locked loop and delay locked loop circuits used in electronic circuits.

2. Description of the Related Art

For certain applications, it is desired to change the frequency of a phase locked loop (PLL) or delay locked loop (DLL) output clock signal based on some configuration such as, for example, changing Peripheral Component Interconnect (PCI) standards. In the past, this required the user to have separate programming object files (POF's) with different settings for each of the different frequencies. In order to change counter and delay settings using POF, the user needs to load the entire new POF for the programmable logic device (PLD) of which the PLL or DLL is a part. Thereafter, the user needs to wait until the PLL or DLL re-acquires lock (i.e., PLL or DLL has phase and frequency locked onto the reference clock.)

The present invention addresses this and other disadvantages of the existing PLL and DLL circuits.

SUMMARY OF THE INVENTION

The present invention allows the user direct access to the counters and delay settings, thus allowing a much faster method to vary the PLL or DLL output frequency and delays. With the present invention, the user may program the counters and delays directly in user mode. In other words, the system including the programmable logic device (PLD) of which the PLL is a part can continue to run while the frequency or phase/delay settings are changed. Thus, the system does not need to be turned off to change the counter or delay settings. Moreover, the counter and delay values (or settings) may be changed without having to load an entire new POF thereby significantly reducing the time required to reconfigure the part. In addition to directly programming counters and delays in user mode, the user may also program the counters and delays by loading a new POF.

The present invention encompasses a PLL circuit. The PLL circuit of the present invention includes: a signal generator and at least one divider coupled to the signal generator, where the at least one divider is programmable in user mode. In one embodiment, the PLL circuit includes a memory device associated with the at least one divider, where the memory device receives settings data and provides settings data to the at least one divider in user mode.

The present invention is explained in more detail below with reference to the drawings.

DETAILED DESCRIPTION OF THE INVENTION

The present invention comprises a PLL circuit with counters and delays directly programmable in user mode. The following description is presented to enable any person skilled in the art to make and use the invention, and is provided in the context of a particular application and its requirements. Various modifications to the embodiments shown will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

The present invention is primarily described and claimed with reference to a PLL circuit. It is to be noted, however, that PLL and DLL circuits are herein used interchangeably. Therefore, references herein to a PLL circuit, either in the description or claims, are not limited to PLL circuits but encompass DLL circuits as well.

Figure 1:
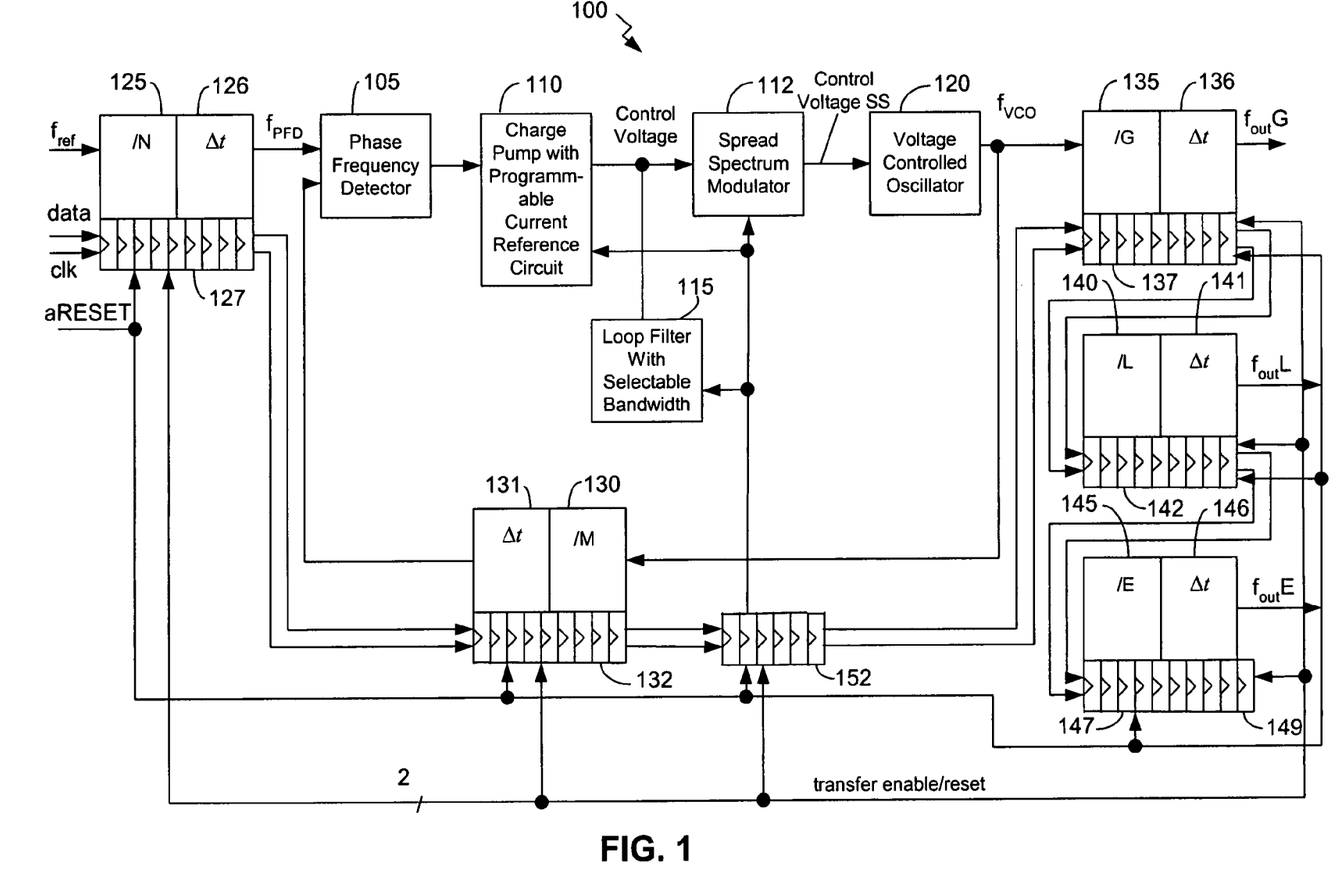
FIG. 1 is a block diagram of a PLL/DLL circuit of the present invention.

FIG. 1 is a block diagram of one embodiment of the PLL circuit 100 of the present invention. The PLL circuit 100 of the present invention includes a phase frequency detector (PFD) 105, a charge pump (CP) with a programmable current reference circuit 110, a spread spectrum modulator 112, a voltage controlled oscillator (VCO) 120, a loop filter with a selectable bandwidth 115, and counters N 125, M 130, G 135, L 140, and E 145.

The CP with a programmable current reference circuit 110 is described in greater detail in the U.S. Patent Application of Wanli Chang and Gregory W. Starr for "Programmable Current Reference Circuit" which is filed concurrently with this application and is incorporated herein by reference. In another embodiment, a CP without a programmable current reference circuit 110, but with a standard current reference circuit, may be used in the PLL circuit 100 of the present invention.

In one embodiment, the spread spectrum modulator 112 is an analog spread spectrum modulator. An analog spread spectrum modulator is described in greater detail in the U.S. Patent Application of Gregory W. Starr and Wanli Chang for "Analog Implementation of Spread Spectrum Frequency Modulation In A Programmable Phase Locked Loop (PLL) System" which is filed concurrently with this application and is incorporated herein by reference. In one embodiment of the PLL circuit 100, the spread spectrum modulator 112 is a digital, rather than an analog, modulator. In yet another embodiment, the PLL circuit 100 of the present invention may be one that does not include the spread spectrum modulator 112.

The loop filter with a selectable bandwidth 115 is described in greater detail in the U.S. Patent Application of Gregory W. Starr and Wanli Chang for "Programmable Loop Bandwidth In Phase Locked Loop (PLL) Circuit" which is filed concurrently with the this application and is incorporated herein by reference. In another embodiment, a loop filter without a selectable bandwidth may be used in the PLL circuit 100 of the present invention.

The PFD 105 compares the feedback clock signal (i.e., the output of divider M 130) with $f_{PFD}$ a divided version of the reference clock signal $f_{ref}$, i.e., after the reference clock signal $f_{ref}$ is passed through divider N 125. Depending on the difference between the two signals compared by the PFD 105 (i.e., depending on whether the VCO 120 needs to operate at a higher or lower frequency), either an up or down signal is provided to the CP with a programmable current reference circuit 110. In response, the CP with a programmable current reference circuit 110 increases current supplied to the loop filter with a selectable bandwidth 115 or reduces current in the loop filter with a selectable bandwidth 115. As a result, a higher or lower control voltage is applied to the spread spectrum modulator 112. The spread spectrum modulator 112 produces a control voltage SS signal, which is a result of the spread spectrum modulation of the control voltage by the spread spectrum modulator 112. The VCO 120 generates a signal $f_{VCO}$ (e.g., a waveform) whose frequency depends on the control voltage (or more specifically, the control voltage SS).

Each of the counters has its associated delay element. Delay elements 126, 131, 136, 141, and 146 are associated with counters N 125, M 130, G 135, L 140, and E 145, respectively. Moreover, there are serial shift registers coupled to each counter for holding programming data (also herein referred to as settings data) to be loaded into the counter and delay elements. Shift registers 127, 132, 137, 142, and 147 are coupled and are associated with counters N 125, M 130, G 135, L 140, and E 145, respectively. In one embodiment, such as that shown in FIG. 1, these serial shift registers are shown separately from the counters. In another embodiment, the serial shift registers may be part of the counters.

In one embodiment, PLL circuit 100 also include shift registers 152. In one embodiment, shift registers 152 may be coupled to the CP 110, the loop filter 115, and the spread spectrum modulator 112. In one embodiment, shift registers 152 are coupled to corresponding hold registers of the CP 110, the loop filter 115, and the spread spectrum modulator 112. In one embodiment, shift registers 152 store programming data for controlling the CP 110, the loop filter 115, and the spread spectrum modulator 112. In one embodiment, the programming data control the state of switches coupled to the variable resistors and/or capacitors in the charge pump 110 and/or the loop filter 115. In one embodiment, the shift registers 152 coupled to the CMOS switches in the charge pump 110 and loop filter 115 are D-type flip flops that provide an output and a complement of the output to the CMOS switches. The variable resistors and capacitors in the loop filter 115 are described in the U.S. Patent Application of Gregory W. Starr and Wanli Chang for "Programmable Loop Bandwidth In Phase Locked Loop (PLL) Circuit" which is filed concurrently with the this application and is incorporated herein by reference. Similarly, the variable resistor in the CP 110 is described in greater detail in the U.S. Patent Application of Wanli Chang and Gregory W. Starr for "Programmable Current Reference Circuit" which is filed concurrently with this application and is incorporated herein by reference.

In one embodiment, the shift registers coupled to the CP 110, the loop filter 115, and the spread spectrum modulator 112 are not in the shift register chain that includes shift registers 127, 132, 137, 142, and 147. Instead, they are separate therefrom. In one embodiment, each of the CP 110, the loop filter 115, and the spread spectrum modulator 112 has a separate set of shift registers that are not part of the same serial shift register chain as that coupled to the other subcomponents of the PLL circuit 100.

Counters N 125, M 130, G 135, L 140, and E 145 may also be referred to as dividers N 125, M 130, G 135, L 140, and E 145. The output of each of dividers N 125, M 130, G 135, L 140, and E 145 is equal to its respective input divided by N, M, G, L, and E, respectively. As a result, for each of dividers N 125, M 130, G 135, L 140, and E 145, the output signal is at a lower frequency than the input signal. In one embodiment, each of N, M, G, L, and E are integers. In another embodiment, N, M, G, L, and E may be non-integers. In one embodiment each of counters N 125, M 130, G 135, L 140, and E 145 includes hold registers for storing the value of N, M, G, L, and E. In one embodiment, the PLL circuit 100 may be without one or more of the dividers N 125, M 130, G 135, L 140, and E 145.

In the PLL circuit 100 of the present invention, counters G 135, L 140, and E 145 provide output signals $f_{outG}$, $f_{outL}$, $f_{outE}$, respectively. The output of counter G 135 is a global output signal in the PLD of which the PLL circuit 100 is a part. The output of counter L 140 is a local output signal. Finally, the output of the counter E 145 is an external output signal that may be coupled to an I/O pin of the PLD of which the PLL circuit 100 is a part. In another embodiment, less than the three counters G, L, and E may be used to provide the global, local, and external output signals. For example, one counter may be used to provides all three output signals. The relationship between the input reference clock frequency ($f_{ref}$) and $f_{outG}$, $f_{outL}$, $f_{outE}$ may be defined as:

$$f_{outG} = \frac{M}{NG} f_{ref};$$

$$f_{outL} = \frac{M}{NL} f_{ref}; \text{ and}$$

$$f_{outE} = \frac{M}{NE} f_{ref}.$$

Thus, the output clock frequency $f_{outG}$ may be changed by varying one or more of the three counter settings (M, N, and G). Similarly, the output clock frequency $f_{outL}$ may be changed by varying one or more of the three counter settings (M, N, and L). Finally, the output clock frequency $f_{outE}$ may be changed by varying one or more of the three counter settings (M, N, and E). Changing the G, L, or E counter does not involve re-locking to the reference clock. Thus, varying the G, L, or E counter may in some cases be a faster method for changing the output frequency. Changing M or N may allow for smaller changes in the output frequencies, particularly in an embodiment where each of the dividers is an integer, rather than a non-integer, divider. In one embodiment, changing the M or N counter values may result in a slow, gradual transition from one frequency to the other without any significant instantaneous change during the transition. This may, for example, be the case when the PLL circuit bandwidth is set to a relatively low value.

In one embodiment, each of counters N 125, M 130, G 135, L 140, and E 145 is a 10 bit counter. More specifically, each of the counters includes two 9 bit counters. In one embodiment, the two 9 bit counters can be programmed separately and one of the 9 bit counters controls the count for the high portion of the cycle (e.g., the high state of a rectangular wave) while the other controls the count for the low portion of the cycle (e.g., the low state of a rectangular wave). This allows adjusting the duty cycle of the output signal from each of the counters.

As noted above, in one embodiment of the present invention, such as that shown in FIG. 1, the PLL circuit 100 includes programmable delay elements with the counters. Like the counters, the delay elements may be programmed separately/directly in user mode. They may also be programmed using a POF. The delay elements allow small phase shifts of the clocks. By allowing these to be varied, it is possible for the end users to automatically tune their designs to optimize setup and hold time, adjust for varying delays of cables and circuit boards, etc.

Figure 2:
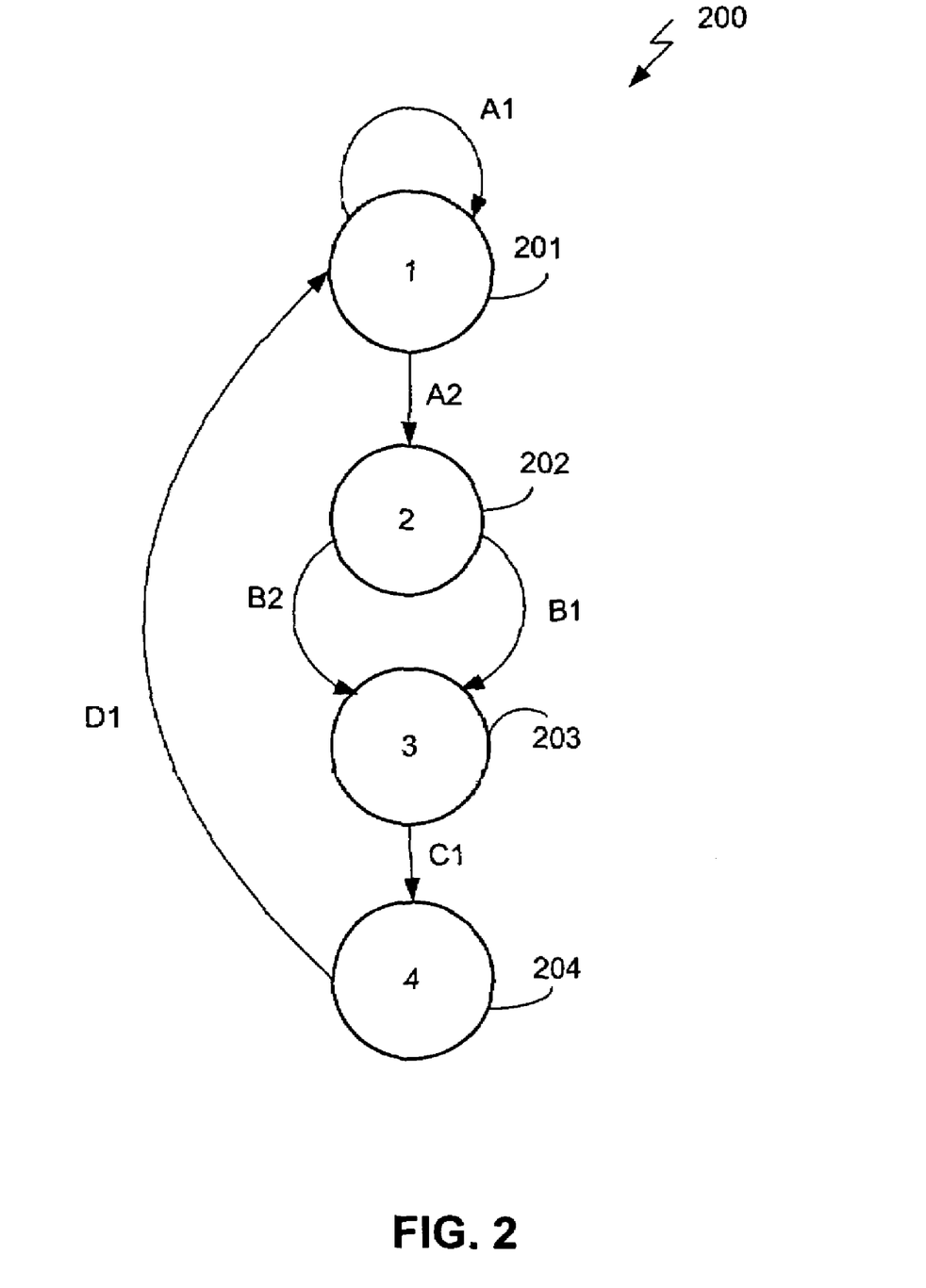
FIG. 2 is a state diagram for the user mode of programming the counters and delay elements of FIG. 1.

FIG. 2 shows a state diagram 200 for the user mode of programming the counters and delay elements. Below are the states and transitions for the state diagram shown in FIG. 2.

States
 1. Start 201
 This is the starting state for the data transfer state machine. In this state, nothing is done until a transfer signal is generated.
 2. Wait 202
 In this state, nothing is done until the transfer condition occurs.
 3. Transfer 203
 In this state, the serial data is transferred from the serial shift registers to the hold registers.
 4. Wait 204
 In this state, the state machine sets the TRANDONE (transfer done) signal high and waits for TRANRST (transfer reset) to go high.

Transitions
 A1. TRANSFER≠high
 A2. TRANSFER=high
 B1. EDGE=high AND CLKIN=↑ (i.e., at a positive edge or transition of CLKIN)
 B2. EDGE=low AND CLKIN=↓ (i.e., at a negative edge or transition of CLKIN)
 C1. Unconditional transfer
 D1. TRANRST=high It is to be noted that the state diagram 200 of FIG. 2 is not the only state diagram that may be used for the user mode of programming the counters and delay elements. Thus, other state diagrams may also be used to allow for the data transfer provided for by the state diagram 200.

As can be seen in FIG. 1, data and clock (clk) signals are input to the serial shift registers 127, 132, 137, 142, 147, and 152. In one embodiment, the lines on which the data and clock signals are delivered to the serial shift registers are coupled to the general routing of the PLD. As a result, the data and clock signals may be driven by core logic of the PLD or by an external device.

Settings data are serially loaded into the serial shift registers 127, 132, 137, 142, 147, and 152, which may also herein be referred to as a serial chain. In one embodiment, when applying new settings, only the serial chain data for counters, delay elements, or other subcomponents (such as charge pump 110, loop filter 115, or spread spectrum modulator 112) whose new settings are different from the current settings is changed. The portion of the serial chain data for the other counters and delay elements remains unchanged.

Once the entire serial chain is loaded, i.e., once the last shift register 149 in the serial chain (which in one embodiment is the rightmost shift register 149 below the counter E and may herein also be referred to as a dummy register 149) receives data, then a transfer enable signal is set high. The transfer enable signal may also be referred to as a ShiftDone signal. Consequently, the counters and delay elements enable the transfer of new counter and delay settings. Thereafter, the serial shift registers 127, 132, 137, 142, 147, and 152 send their data to the respective hold registers in their corresponding counters/delay elements or other subcomponents (such as charge pump 1110 or loop filter 115). The hold registers may also herein be referred to as shadow registers.

In one embodiment, the shift registers associated with a divider synchronously transfer their data to the hold registers associated with the same divider. In one embodiment, the transfer from the shift registers to the hold registers may be programmable to occur on the rising edge or falling edge of the clock. Similarly, the shift registers associated with other subcomponents of the PLL circuit 100 synchronously transfer their data to the hold registers associated with those other subcomponents. For example, the shift registers associated with the loop filter 115 synchronously transfer their data to the hold registers associated with the loop filter 115.

In one embodiment, when the ShiftDone signal is high, on the next rising edge of the clock signal before delay, the new value for the high count of the divider is transferred from the shift registers to the hold registers associated with the divider. The clock signal before delay is the state of the clock signal before it is input into the divider. The clock signal after delay is the state of the clock signal after the added delay of the divider, i.e., right after the clock signal passes through the divider. The new value for the high count will begin to be used on the next high pulse (i.e., the rising edge) of the clock signal before delay. The next falling edge of the clock signal after delay sets a LoadDone signal high. Upon setting the LoadDone signal high, a new low count is transferred from the shift registers to the hold registers associated with the divider. The new value for the low count will begin to be used on the next falling edge of the clock signal before delay. Also, on the falling edge of the clock signal after delay, a new delay value if transferred from the shift registers to the hold registers. The new delay value is applied on the next rising edge of the clock signal after delay.

Once the transfer of new counter and delay settings data is completed, the transfer reset signal is set high. As a result, all the serial shift registers 127, 132, 137, 142, and 147 are reset to 0. Similarly, once transfer of data from shift registers 152 is completed, shift registers 152 are reset to 0.

In one embodiment, the counters N 125 and M 130 are loaded synchronously. In one embodiment, the system is designed to wait until one of the counters N 125 or M 130 ends its count before new counter values are loaded into both counters N 125 and M 130. In one embodiment, counters N 125 and M 130 are loaded with new counter values when the outputs of both counters N 125 and M 130 are in a low state. In another embodiment, counters N 125 and M 130 may be loaded with new counter values when the outputs of both are in a high state.

The present invention provides a separate serial interface that allows the user to access and reset the counter and delay settings in user mode. As noted above, the direct, real time reprogramming of the counters and delay elements in user mode does not exclude the ability to program the counters using POF. Thus, the counters N 125, M 130, G 135, L 140, and E 145 and their corresponding delay elements 126, 131, 136, 141, and 146 may also be programmed by the POF.

The PLL or DLL circuit of the present invention may be used in many systems. For example, the PLL or DLL circuit may be used in a digital system. More specifically, the PLL or DLL circuit may be used in a digital system comprising a PLD, which as used herein also refers to complex PLD's (CPLD's). Additionally, the PLL or DLL circuit may be used in a PLD. In one embodiment, the PLL or DLL circuit is on the same die/chip as the PLD. In one embodiment, the counters may be reprogrammed to select a different frequency in real time while the PLD is in user mode. As used herein a digital system is not intended to be limited to a purely digital system, but also encompasses hybrid systems that include both digital and analog subsystems. Thus, the present invention encompasses digital systems that include the PLL or DLL circuit described herein.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the appended claims.

The invention claimed is:

1. A loop circuit comprising:
   a signal generator;
   at least one divider coupled to the signal generator;
   at least one delay element coupled to and associated with the at least one divider; and
   memory, coupled to the at least one divider and the at least one delay element, for receiving divider settings data and delay settings data during user mode, transferring the divider settings data into the at least one divider during user mode, and transferring the delay settings data into the at least one delay element during user mode.

2. The loop circuit of claim 1 further comprising a detector coupled to the signal generator, wherein the at least one divider comprises a first divider, further wherein the first divider is coupled to the signal generator and a first input node of the detector, wherein the first divider receives a signal generator output signal from the signal generator and provides a first input signal to the first input node of the detector.

3. The loop circuit of claim 2 wherein the at least one divider comprises a second divider coupled to a second input node of the detector, wherein the second divider is programmable in user mode, further wherein the second divider receives a reference clock signal and provides a second input signal to the second input node of the detector.

4. The loop circuit of claim 3 wherein the at least one divider further comprises a third divider coupled to the signal generator, wherein the third divider is programmable in user mode, further wherein the third divider receives the signal generator output signal from the signal generator and provides a first output clock signal.

5. The loop circuit of claim 4 wherein the at least one delay element comprises:
   a first delay element, wherein the first delay element is programmable in user mode and is associated with the first divider;
   a second delay element, wherein the second delay element is programmable in user mode and is associated with the second divider; and
   a third delay element, wherein the third delay element is programmable in user mode and is associated with the third divider.

6. The loop circuit of claim 5 wherein the memory comprises:
   a first set of shift registers, wherein the first set of shift registers is associated with the first divider and the first delay element, further wherein the first set of shift registers provides settings data to the first divider and the first delay element in user mode;
   a second set of shift registers, wherein the second set of shift registers is associated with the second divider and the second delay element, further wherein the second set of shift registers provides settings data to the second divider and second delay element in user mode; and
   a third set of shift registers, wherein the third set of shift registers is associated with the third divider and the third delay element, further wherein the third set of shift registers provides settings data to the third divider and the third delay element in user mode.

7. The loop circuit of claim 6, wherein
   the first set of shift registers provides settings data to first hold registers associated with the first divider and the first delay element in user mode;
   the second set of shift registers provides settings data to second hold registers associated with the second divider and the second delay element in user mode; and
   the third set of shift registers provides settings data to third hold registers associated with the third divider and the third delay element in user mode.

8. The loop circuit of claim 6, wherein the first, second and third sets of shift registers may be loaded with new settings data for programming the first, second, and third dividers, respectively, in user mode.

9. The loop circuit of claim 8 further comprising:
   a fourth divider coupled to the signal generator, wherein the fourth divider is programmable in user mode, further wherein the fourth divider receives the signal generator output signal from the signal generator and provides a second output clock signal;
   a fifth divider coupled to the signal generator, wherein the fifth divider is programmable in user mode, further wherein the fifth divider receives the signal generator output signal from the signal generator and provides a third output clock signal;
   a fourth delay element, wherein the fourth delay element is programmable in user mode and is associated with the fourth divider;
   a fifth delay element, wherein the fifth delay element is programmable in user mode and is associated with the fifth divider;
   a fourth set of shift registers, wherein the fourth set of shift registers is associated with the fourth divider and the fourth delay element, further wherein the fourth set of shift registers provides settings data to the fourth divider and the fourth delay element in user mode; and
   a fifth set of shift registers, wherein the fifth set of shift registers is associated with the fifth divider and the fifth delay element, further wherein the fifth set of shift registers provides settings data to the fifth divider and the fifth delay element in user mode;
   wherein the fourth and fifth sets of shift registers may be loaded with new settings data for programming the fourth and fifth dividers, respectively, in user mode.

10. The loop circuit of claim 9, wherein each of the first, second, third, fourth, and fifth dividers comprises first and second 9 bit counters, wherein the first 9 bit counter stores a count for a logical high portion of a cycle and the second 9 bit counter stores a count for a logical low portion of a cycle.

11. The loop circuit of claim 9, wherein settings data are serially loaded in the first, second, third, fourth, and fifth sets of shift registers, further wherein the fifth set of shift registers comprises a dummy register, wherein when the dummy register receives a new data signal, a transfer enable signal is set high enabling transfer of divider and delay settings data to the first, second, third, fourth, and fifth dividers and delay elements.

12. The loop circuit of claim 11, wherein only settings data for dividers and delay elements whose new settings are different from their current settings are changed when loading settings data into shift registers.

13. The loop circuit of claim 11, wherein the first and second dividers are loaded with new settings data synchronously.

14. The loop circuit of claim 9, wherein
the first set of shift registers provides settings data to first hold registers associated with the first divider and the first delay element in user mode;
the second set of shift registers provides settings data to second hold registers associated with the second divider and the second delay element in user mode;
the third set of shift registers provides settings data to third hold registers associated with the third divider and the third delay element in user mode;
the fourth set of shift registers provides settings data to fourth hold registers associated with the fourth divider and the fourth delay element in user mode; and
the fifth set of shift registers provides settings data to fifth hold registers associated with the fifth divider and the fifth delay element in user mode.

15. A digital system including a programmable logic device and the loop circuit of claim 1.

16. A programmable logic device including the loop circuit of claim 1.

17. The loop circuit of claim 1, wherein the memory comprises shift registers associated with the at least one divider and the at least one delay element.

18. The loop circuit of claim 17, wherein the shift registers provide settings data to hold registers associated with the at least one divider and the at least one delay element in user mode.

19. The loop circuit of claim 17, wherein lines on which settings data are provided to the serial shift registers are coupled to general routing of a programmable logic device.

20. A loop circuit comprising:
a feedback loop comprising a first divider;
a second divider coupled to the feedback loop;
first and second delay elements coupled to and associated with the first and second dividers, respectively; and
memory, coupled to the first and second dividers and the first and second delay elements, for receiving divider settings data and delay settings data during user mode, transferring the divider settings data into the first and second dividers during user mode, and transferring the delay settings data into the first and second delay elements during user mode.

21. The loop circuit of claim 20 wherein:
the memory comprises first and second memory devices;
the first memory device is associated with the first divider and the first delay element, receives first divider settings data and first delay settings data in user mode, and provides the first divider settings data and the first delay settings data to the first divider and the first delay element, respectively, in user mode; and
the second memory device is associated with the second divider and the second delay element, receives second divider settings data and second delay settings data during user mode, and provides the second divider settings data and the second delay settings data to the second divider and the second delay element, respectively, in user mode.

22. The loop circuit of claim 21, wherein the first memory device comprises first shift registers and the second memory device comprises second shift registers.

23. The loop circuit of claim 22, wherein the first shift registers provide settings data to first hold registers associated with the first divider in user mode and the second shift registers provide settings data to second hold registers associated with the second divider in user mode.

24. The loop circuit of claim 22, wherein lines on which settings data are provided to the first and second serial shift registers are coupled to general routing of a programmable logic device.

25. A digital system including a programmable logic device and the loop circuit of claim 20.

26. A programmable logic device including the loop circuit of claim 20.

27. The loop circuit of claim 20, wherein the feedback loop comprises:
a detector; and
a signal generator coupled to the detector;
wherein the first divider and the first delay element are coupled to the signal generator and a first input node of the detector, wherein the first divider and the first delay element receive a signal generator output signal from the signal generator and provide a first input signal to the first input node of the detector.

28. The loop circuit of claim 27, wherein the second divider and the second delay element are coupled to a second input node of the detector, wherein the second divider and the second delay element receive a reference clock signal and provide a second input signal to the second input node of the detector.

29. The loop circuit of claim 28 further comprising a third divider coupled to the signal generator, wherein the third divider is programmable in user mode, further wherein the third divider receives the signal generator output signal from the signal generator and provides a first output clock signal.

30. The loop circuit of claim 29 further comprising a third delay element, wherein the third delay element is programmable in user mode and is associated with the third divider.

31. The loop circuit of claim 30 wherein the memory comprises:
a first set of shift registers, wherein the first set of shift registers is associated with the first divider and the first delay element, further wherein the first set of shift registers provides first divider settings data and first delay settings data to the first divider and the first delay element, respectively, in user mode;
a second set of shift registers, wherein the second set of shift registers is associated with the second divider and the second delay element, further wherein the second set of shift registers provides second divider settings data and second delay settings data to the second divider and second delay element, respectively, in user mode; and a third set of shift registers, wherein the third set of shift registers is associated with the third divider and the third delay element, further wherein the third set of shift registers provides third divider settings data and third delay settings data to the third divider and the third delay element, respectively, in user mode.

32. The loop circuit of claim 31, wherein
the first set of shift registers provide settings data to first hold registers associated with the first divider and the first delay element in user mode;
the second shift registers provide settings data to second hold registers associated with the second divider and the second delay element in user mode; and
the third set of shift registers provide settings data to third hold registers associated with the third divider and the third delay element in user mode.

33. The loop circuit of claim 31, wherein the first, second and third sets of shift registers may be loaded with new settings data for programming the first, second, and third dividers, respectively, in user mode.

34. The loop circuit of claim 33 further comprising:
a fourth divider coupled to the signal generator, wherein the fourth divider is programmable in user mode, further wherein the fourth divider receives the signal generator output signal from the signal generator and provides a second output clock signal;
a fifth divider coupled to the signal generator, wherein the fifth divider is programmable in user mode, further wherein the fifth divider receives the signal generator output signal from the signal generator and provides a third output clock signal;
a fourth delay element, wherein the fourth delay element is programmable in user mode and is associated with the fourth divider;
a fifth delay element, wherein the fifth delay element is programmable in user mode and is associated with the fifth divider;
a fourth set of shift registers, wherein the fourth set of shift registers is associated with the fourth divider and the fourth delay element, further wherein the fourth set of shift registers provides settings data to the fourth divider and the fourth delay element in user mode; and
a fifth set of shift registers, wherein the fifth set of shift registers is associated with the fifth divider and the fifth delay element, further wherein the fifth set of shift registers provides settings data to the fifth divider and the fifth delay element in user mode;
wherein the fourth and fifth sets of shift registers may be loaded with new settings data for programming the fourth and fifth dividers, respectively, in user mode.

35. The loop circuit of claim 34, wherein
the first set of shift registers provide settings data to first hold registers associated with the first divider and the first delay element in user mode;
the second shift registers provide settings data to second hold registers associated with the second divider and the second delay element in user mode;
the third set of shift registers provide settings data to third hold registers associated with the third divider and the third delay element in user mode;
the fourth set of shift registers provide settings data to fourth hold registers associated with the fourth divider and the fourth delay element in user mode; and
the fifth set of shift registers provide settings data to fifth hold registers associated with the fifth divider and the fifth delay element in user mode.

36. The loop circuit of claim 34, wherein each of the first, second, third, fourth, and fifth dividers comprises first and second 9 bit counters, wherein the first 9 bit counter stores a count for a logical high portion of a cycle and the second 9 bit counter stores a count for a logical low portion of a cycle.

37. The loop circuit of claim 34, wherein the settings data are serially loaded in the first, second, third, fourth, and fifth sets of shift registers, further wherein the fifth set of shift registers comprises a dummy register, wherein when the dummy register receives a new data signal, a transfer enable signal is set high enabling transfer of divider and delay settings data to the first, second, third, fourth, and fifth dividers and delay elements.

38. The loop circuit of claim 37, wherein only settings data for dividers and delay elements whose new settings are different from their current settings are changed when loading settings data into shift registers.

39. The loop circuit of claim 37, wherein the first and second dividers are loaded with new settings data synchronously.

40. A method of providing an output clock signal from a clock circuit, the method comprising:
receiving a new divider value and a new delay value from outside the clock circuit during user mode;
reprogramming a divider setting of a divider and a delay setting of a delay element, coupled to and associated with the divider, with the new divider value and the new delay value, respectively;
providing a divider output and a delay output; and
generating an output clock signal in response to the divider output and the delay output.

41. The method of claim 40, wherein the reprogramming comprises:
loading settings data into serial shift registers associated with the divider and the delay element; and
transferring the settings data from the serial shift registers to hold registers associated with the divider and the delay element.

42. The method of claim 41, wherein the transferring is programmable to occur on one of a rising edge or a falling edge of a clock signal.

43. The method of claim 42, wherein the transferring comprises synchronously transferring data from the serial shift registers to the hold registers associated with the divider and the delay element.

44. A loop circuit for receiving a reference clock signal and generating an output clock signal, the loop circuit comprising:
a feedback circuit for receiving a signal coupled to the reference clock signal and a feedback clock signal coupled to the output clock signal;
delay circuitry, coupled to the feedback circuit and the reference clock signal, for introducing a phase delay between the reference clock signal and the output clock signal in response to the loop circuit receiving a phase-adjust signal during user mode, wherein the phase delay is determined by the phase-adjust signal.

45. The loop circuit of claim 44 further comprising:
a memory device associated with the delay circuitry, wherein:
the memory device receives settings data and provides the settings data to the delay circuitry in user mode.

46. The loop circuit of claim 44 further comprising at least one divider coupled to the feedback clock signal.

47. The loop circuit of claim 46 further comprising:
a set of shift registers, wherein:
the set of shift registers receives settings data and provides the settings data to the delay circuitry and the at least one divider in user mode.

48. The loop circuit of claim 44 further comprising a plurality of buffers coupled to the feedback circuit.

49. The loop circuit of claim 48, further comprising second delay circuitry coupled to an output of the plurality of buffers for introducing a second phase delay between the reference clock signal and the output clock signal in response to the loop circuit receiving a second phase-adjust signal during user mode.

50. The loop circuit of claim 49, further comprising:
third delay circuitry, wherein:
the third delay circuitry is coupled to an output of the plurality of buffers;
the third delay circuitry is coupled to the output clock signal of the loop circuit; and
the third delay circuitry introduces a third phase delay between the reference clock signal and the output clock signal in response to receiving the phase-adjust signal.

51. The loop circuit of claim 50, further comprising:
a first set of shift registers;
a second set of shift registers; and
a third set of shift registers; wherein:
the first set of shift registers is associated with the first delay circuitry;
a value is received by the first set of shift registers during user mode and transferred into the first delay circuitry;
the second set of shift registers is associated with the second delay circuitry;
a value is received by the second set of shift registers during user mode and transferred into the second delay circuitry;
the third set of shift registers is associated with the third delay circuitry; and
a value is received by the third set of shift registers during user mode and transferred into the third delay circuitry.

52. A programmable logic device comprising the loop circuit of claim 44.

53. A digital system comprising the programmable logic device of claim 52.

54. A method of providing an output clock signal from a loop circuit, the method comprising:
receiving a reference clock signal during user mode;
receiving a phase-adjust signal during user mode; and
modifying settings data of delay circuitry coupled to the reference clock signal in response to receiving the phase-adjust signal, wherein the modifying the settings data causes a phase delay between the reference clock signal and the output clock signal, and wherein the phase delay is determined by the phase-adjust signal.

55. The method of claim 54, wherein the modifying the settings data is programmable to occur on one of a rising edge or a falling edge of a clock signal.

56. The method of claim 54, wherein the modifying the settings data comprises:
loading settings data into serial shift registers associated with delay circuitry; and
transferring the settings data from the serial shift registers to hold registers associated with the delay circuitry.

57. A loop circuit for receiving a reference clock signal and generating an output clock signal, the loop circuit comprising:
a feedback circuit for receiving the reference clock signal and a feedback clock signal;
frequency multiplication circuitry, coupled to the feedback circuit, for increasing a frequency of the output clock signal by a multiplication factor received by the loop circuit during user mode;
frequency division circuitry, coupled to the feedback circuit, for decreasing the frequency of the output clock signal by a division factor received by the loop circuit during user mode; and
delay circuitry, coupled to and associated with one of the frequency multiplication circuitry and the frequency division circuitry, for introducing a phase delay between the reference clock signal and the output clock signal by a delay setting received by the loop circuit during user mode.

58. The loop circuit of claim 57 further comprising a plurality of buffers coupled to the feedback circuit.

59. The loop circuit of claim 58 wherein:
the frequency division circuitry is coupled to the feedback circuit through the plurality of buffers; and
the frequency division circuitry is coupled to the output clock signal.

60. The loop circuit of claim 59 wherein the frequency division circuitry comprises a divider.

61. The loop circuit of claim 58 wherein:
the frequency multiplication circuitry is coupled to the plurality of buffers; and
the frequency multiplication circuitry is coupled to the feedback clock signal.

62. The loop circuit of claim 59 wherein the frequency multiplication circuitry comprises a divider.

63. The loop circuit of claim 57 further comprising a memory device associated with the multiplication circuitry, wherein the memory device receives first settings data and provides the first settings data to the multiplication circuitry during user mode.

64. The loop circuit of claim 63 wherein the memory device comprises a first plurality of shift registers.

65. The loop circuit of claim 64 further comprising a memory device associated with the division circuitry, wherein the memory device receives second settings data and provides the second settings data to the division circuitry during user mode.

66. The loop circuit of claim 65 wherein the memory device comprises a second plurality of shift registers coupled to the first plurality of shift registers.

67. A programmable logic device comprising the loop circuit of claim 57.

68. A digital system comprising the programmable logic device of claim 67.

69. A method of providing an output clock signal from a loop circuit, the method comprising:
receiving a multiplication factor during user mode from outside the clock circuit;
causing a frequency of the output clock signal to increase by the received multiplication factor, wherein the causing the frequency of the output clock signal to increase comprises loading the received multiplication factor into multiplication circuitry;
receiving a division factor during user mode from outside the clock circuit;
causing the frequency of the output clock signal to decrease by the received division factor, wherein the causing the frequency of the output clock signal to decrease comprises loading the received division factor into division circuitry;
receiving a delay setting during user mode from outside the clock circuit; and causing a phase of the output clock signal to shift by the received delay setting, wherein the causing the phase of the output clock signal to shift comprises loading the received delay setting into a delay element coupled to and associated with one of the multiplication circuitry and the division circuitry.

70. The method of claim 69 wherein the causing the frequency of the output clock signal to decrease by the received division factor comprises modifying a divider ratio of a divider that is coupled to the output clock signal.

71. The method of claim 70 wherein:
the receiving the division factor comprises writing the division factor into a plurality of registers; and
the causing the frequency of the output clock signal to decrease by the received division factor further comprises outputting the division factor from the plurality of registers into the divider.

72. The method of claim 71 wherein:
the plurality of registers comprises a plurality of shift registers; and
the writing the division factor comprises shifting the division factor into the plurality of shift registers.

73. The method of claim 69 wherein causing the frequency of the output clock signal to increase by the received multiplication factor comprises modifying a divider ratio of a divider.

74. The method of claim 73 wherein:
receiving the multiplication factor comprises writing the multiplication factor into a plurality of registers; and
causing the frequency of the output clock signal to increase by the received multiplication factor further comprises outputting the multiplication factor from the plurality of registers into the divider.

75. The method of claim 74 wherein:
the plurality of registers comprises a plurality of shift registers; and
the writing the multiplication factor comprises shifting the multiplication factor into the plurality of shift registers.

76. A loop circuit for receiving a reference clock signal and generating an output clock signal, the loop circuit comprising:
a feedback circuit for receiving a signal coupled to the reference clock signal and a feedback clock signal coupled to the output clock signal;
delay circuitry, coupled to the feedback circuit and the reference clock signal, for introducing a phase delay between the reference clock signal and the output clock signal; and
memory circuitry, coupled to the delay circuitry, for receiving delay data during configuration and modifying the delay data during user mode with new delay data, wherein the phase delay is determined by the delay data.

77. The loop circuit of claim 76 wherein the delay data are modified by shifting the new delay data into the memory circuitry.

78. The loop circuit of claim 76 wherein the delay data are modified by writing the new delay data to the memory circuitry.

79. The loop circuit of claim 78 wherein the new delay data are generated external to the loop circuit.

80. The loop circuit of claim 79, wherein:
the loop circuit is part of a programmable logic device (PLD); and
the new delay data are generated by core logic of the PLD.

81. The loop circuit of claim 79, wherein:
the loop circuit is part of a programmable logic device (PLD); and
the new delay data are generated external to the PLD.

82. A loop circuit for receiving a reference clock signal and generating an output clock signal, the loop circuit comprising:
a feedback circuit for receiving a signal coupled to the reference clock signal and a feedback clock signal coupled to the output clock signal;
delay circuitry, coupled to the feedback circuit and the reference clock signal, for introducing a phase delay between the reference clock signal and the output clock signal; and
memory circuitry, coupled to the delay circuitry, for storing delay data and updating the delay data during user mode with settings data generated outside the loop circuit, wherein the phase delay is determined by the delay data.

83. The loop circuit of claim 82, wherein:
the loop circuit is part of a programmable logic device (PLD); and
the settings data are generated by core logic of the PLD.

84. The loop circuit of claim 82, wherein:
the loop circuit is part of a programmable logic device (PLD); and
the settings data are generated external to the PLD.

85. The loop circuit of claim 82 wherein the delay data are updated by writing the settings data to the memory circuitry.

86. The loop circuit of claim 82 wherein the delay data are updated by shifting the settings data into the memory circuitry.

87. A programmable logic device comprising:
at least one logic block;
configuration memory cells associated with the at least one logic block; and
a loop circuit comprising:
a signal generator;
a divider coupled to the signal generator;
a delay element coupled to and associated with the divider; and
a memory, coupled to the divider and the delay element, for determining the operation of the divider and the delay element, wherein a value stored in the memory coupled to the divider and the delay element can be modified during user mode without changing the configuration memory cells associated with the at least one logic block.

88. The programmable logic device of claim 87 wherein the divider and the delay element are coupled to an output of the signal generator and an output of the loop circuit.

89. The programmable logic device of claim 87 wherein the memory comprises at least one register.

90. The programmable logic device of claim 87 wherein the memory can be modified during user mode with settings data from outside the loop circuit.

91. A programmable logic device comprising:
at least one logic block;
configuration memory cells associated with the at least one logic block; and
a loop circuit comprising:
a feedback loop comprising a first divider;
a second divider coupled to the feedback loop;
first and second delay elements associated with the first and second dividers, respectively; and
a memory, coupled to the first and second dividers and the first and second delay elements, for determining the operation of the first and second dividers and the first and second delay elements, wherein a value stored in the memory coupled to the first and second dividers and the first and second delay elements can be modified during user mode without changing the configuration memory cells associated with the at least one logic block.

92. The programmable logic device of claim 91 wherein the memory comprises at least one register.

93. The programmable logic device of claim 91 wherein the memory can be modified during user mode with settings data from outside the loop circuit.

94. A programmable logic device comprising:
 at least one logic block;
 configuration memory cells associated with the at least one logic block; and
 a loop circuit for receiving a reference clock signal and generating an output clock signal, the loop circuit comprising:
  a feedback circuit for receiving a signal coupled to the reference clock signal and a feedback clock signal coupled to the output clock signal;
  delay circuitry, coupled to the feedback circuit and the reference clock signal, for introducing a phase delay between the reference clock signal and the output clock signal in response to the loop circuit receiving a phase-adjust signal during user mode, wherein the phase delay is determined by the phase-adjust signal; and
  a memory, coupled to the delay circuitry, for determining the operation of the delay circuitry, wherein a value stored in the memory coupled to the delay circuitry can be modified during user mode without changing the configuration memory cells associated with the at least one logic block.

95. The programmable logic device of claim 94 wherein the memory comprises at least one register.

96. The programmable logic device of claim 94 wherein the memory can be modified during user mode with settings data from outside the loop circuit.

97. A programmable logic device comprising:
 at least one logic block;
 configuration memory cells associated with the at least one logic block; and
 a loop circuit for receiving a reference clock signal and generating an output clock signal, the loop circuit comprising:
  a feedback circuit for receiving the reference clock signal and a feedback clock signal coupled to the output clock signal;
  frequency multiplication circuitry, coupled to the feedback circuit, for increasing a frequency of the output clock signal by a multiplication factor received by the loop circuit during user mode;
  frequency division circuitry, coupled to the feedback circuit, for decreasing the frequency of the output clock signal by a division factor received by the loop circuit during user mode;
  delay circuitry, coupled to and associated with one of the frequency multiplication circuitry and the frequency division circuitry, for introducing a phase delay between the reference clock signal and the output clock signal by a delay setting received by the loop circuit during user mode; and
  a memory, coupled to at least one of the frequency multiplication circuitry, the frequency division circuitry, and the delay circuitry, for determining the operation of at least one of the frequency multiplication circuitry, the frequency division circuitry, and the delay circuitry, wherein a value stored in the memory coupled to at least one of the frequency multiplication circuitry, the frequency division circuitry, and the delay circuitry can be modified during user mode to affect operation of at least one of the frequency multiplication circuitry, the frequency division circuitry, and the delay circuitry without changing the configuration memory cells associated with the at least one logic block.

98. The programmable logic device of claim 97 wherein the memory comprises at least one register.

99. The programmable logic device of claim 97 wherein the memory can be modified during user mode with settings data from outside the loop circuit.

100. A programmable logic device comprising:
 at least one logic block;
 configuration memory cells associated with the at least one logic block; and
 a loop circuit for receiving a reference clock signal and generating an output clock signal, the loop circuit comprising:
  a feedback circuit for receiving a signal coupled to the reference clock signal and a feedback clock signal coupled to the output clock signal;
  delay circuitry, coupled to the feedback circuit and the reference clock signal, for introducing a phase delay between the reference clock signal and the output clock signal; and
  memory circuitry, coupled to the delay circuitry, for receiving delay data during configuration and for modifying the delay data during user mode without changing the configuration memory cells associated with the at least one logic block, wherein the phase delay is determined by the delay data.

101. The programmable logic device of claim 100 wherein the memory circuitry comprises at least one register.

102. The programmable logic device of claim 100 wherein the memory circuitry can be modified during user mode with delay data from outside the loop circuit.

103. A programmable logic device comprising:
 at least one logic block;
 configuration memory cells associated with the at least one logic block; and
 a loop circuit for receiving a reference clock signal and generating an output clock signal, the loop circuit comprising:
  a feedback circuit for receiving a signal coupled to the reference clock signal and a feedback clock signal coupled to the output clock signal;
  delay circuitry, coupled to the feedback circuit and the reference clock signal, for introducing a phase delay between the reference clock signal and the output clock signal; and
  memory circuitry, coupled to the delay circuitry, for storing delay data and for updating the delay data during user mode with settings data generated outside the loop circuit without changing the configuration memory cells associated with the at least one logic block, wherein the phase delay is determined by the delay data.

104. The programmable logic device of claim 103 wherein the memory circuitry comprises at least one register.

* * * * *